United States Patent
Lee et al.

(10) Patent No.: US 8,138,057 B2
(45) Date of Patent: Mar. 20, 2012

(54) METAL OXIDE ALLOY LAYER, METHOD OF FORMING THE METAL OXIDE ALLOY LAYER, AND METHODS OF MANUFACTURING A GATE STRUCTURE AND A CAPACITOR INCLUDING THE METAL OXIDE ALLOY LAYER

(75) Inventors: Jung-Ho Lee, Suwon-si (KR); Jung-Sik Choi, Dongdaemun-gu (KR); Jun-Hyun Cho, Suwon-si (KR); Tae-Min Eom, Seoul (KR); Ji-Hyun Lee, Seoul (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 880 days.

(21) Appl. No.: 12/196,566

(22) Filed: Aug. 22, 2008

(65) Prior Publication Data
US 2008/0305591 A1    Dec. 11, 2008

Related U.S. Application Data

(62) Division of application No. 11/328,014, filed on Jan. 9, 2006, now Pat. No. 7,427,573.

(30) Foreign Application Priority Data

Jan. 10, 2005   (KR) .......................... 10-2005-0002168

(51) Int. Cl.
*H01L 21/20* (2006.01)
*H01L 21/336* (2006.01)
(52) U.S. Cl. ................. 438/396; 438/591; 257/E21.008; 257/E21.048

(58) Field of Classification Search .................. 438/396, 438/591; 257/E21.008, E21.048
See application file for complete search history.

(56) References Cited

U.S. PATENT DOCUMENTS

| | | | | |
|---|---|---|---|---|
| 4,486,487 A * | 12/1984 | Skarp | ............................. | 428/216 |
| 6,570,253 B1 * | 5/2003 | Lim et al. | ........................ | 257/758 |
| 6,645,882 B1 * | 11/2003 | Halliyal et al. | ................ | 438/785 |
| 7,052,918 B2 * | 5/2006 | Lim et al. | ............................ | 438/3 |
| 7,053,009 B2 * | 5/2006 | Conley et al. | .................. | 438/785 |
| 7,135,422 B2 * | 11/2006 | Nam et al. | ..................... | 438/785 |
| 7,393,796 B2 * | 7/2008 | Ahn et al. | ........................ | 438/785 |
| 7,427,573 B2 * | 9/2008 | Lee et al. | ........................ | 438/785 |
| 2003/0108674 A1 * | 6/2003 | Chung et al. | ............. | 427/255.394 |
| 2004/0017280 A1 * | 1/2004 | Yamamoto et al. | ............ | 336/234 |
| 2004/0219746 A1 * | 11/2004 | Vaartstra et al. | ............... | 438/240 |
| 2004/0266217 A1 * | 12/2004 | Kim et al. | ....................... | 438/778 |
| 2007/0090439 A1 * | 4/2007 | Ahn et al. | ....................... | 257/310 |

FOREIGN PATENT DOCUMENTS

KR    2003-0092596    * 12/2003

* cited by examiner

*Primary Examiner* — Evan Pert
(74) *Attorney, Agent, or Firm* — F. Chau & Associates, LLC

(57) ABSTRACT

A metal oxide alloy layer comprises a first layer including a first metal oxide and having a first thickness, and a second layer formed on the first layer, the second layer including a second metal oxide and having a second thickness, wherein a value of the first thickness is such that the first metal oxide is allowed to move into the second layer and a value of the second thickness is such that the second metal oxide is allowed to move into the first layer to form a single-layered structure in which the first and second metal oxides are mixed.

20 Claims, 11 Drawing Sheets

METAL OXIDE ALLOY LAYER, METHOD OF FORMING THE METAL OXIDE ALLOY LAYER, AND METHODS OF MANUFACTURING A GATE STRUCTURE AND A CAPACITOR INCLUDING THE METAL OXIDE ALLOY LAYER

CROSS-REFERENCE TO RELATED APPLICATIONS

This is a divisional application of U.S. application Ser. No. 11/328,014 filed on Jan. 9, 2006 now U.S. Pat. No. 7,427,573, which claims priority to Korean Appln. No. 2005-0002168 filed Jan. 10, 2005, the contents of which are incorporated herein by reference in their entireties.

BACKGROUND OF THE INVENTION

1. Technical Field

The present disclosure relates to a metal oxide alloy layer, and more particularly, to a metal oxide alloy layer having a structure in which at least two kinds of metal oxides are mixed and methods of forming the same.

2. Discussion of the Related Art

As semiconductor devices become highly integrated, a size of a cell region is reduced. As a result of the reduced-size cell region, a sufficient capacitance for stably operating a cell in a semiconductor device such as a dynamic random access memory (DRAM) device may not be obtained. As shown in the following Equation 1, the capacitance C is proportional to a dielectric constant $\epsilon$ and areas A of electrodes, and is inversely proportional to a distance d between the electrodes.

$$C = \epsilon A/d \qquad \text{Equation 1}$$

To increase a capacitance of a capacitor having a silicon oxide layer or a silicon nitride layer as a dielectric layer, a lower electrode of the capacitor has a cylindrical shape or a fin shape to expand an effective area of the capacitor. However, the lower electrode of the capacitor having the cylindrical shape or the fin shape is a complicated structure to manufacture.

Thus, in a conventional technology, a thin layer including a material that has a high dielectric constant is employed as the dielectric layer of the capacitor or as a gate insulation layer of a MOS transistor. The thin layer having a high dielectric constant functions to sufficiently reduce a leakage current between a gate electrode and a channel or between a lower electrode and an upper electrode while having a thin equivalent oxide thickness (EOT). Examples of the material having a high dielectric constant include metal oxide such as $Al_2O_3$, $Ta_2O_5$, $Nb_2O_5$, $ZrO_2$, and $TiO_2$. The metal oxide has a dielectric constant of about 10 k to about 114 k. Silicon oxide has a dielectric constant of about 3.9 k. Thus, the dielectric constant of the metal oxide is about 2.5 times to about 30 times higher than that of the silicon oxide.

However, when a hafnium oxide layer is used as a gate insulation layer and when a polysilicon layer used as a gate conductive layer is formed on the hafnium oxide layer, impurities such as boron are penetrated into a channel region so that electron mobility in the channel region is reduced. As a result, a metal oxide layer needs to have good leakage current characteristics and a high dielectric constant, which can be applied to a process for manufacturing a semiconductor device having a design rule of no more than about 70 nm.

SUMMARY OF THE INVENTION

Embodiments of the present invention provide a metal oxide alloy layer having improved leakage current characteristics and a high dielectric constant, and a method of forming the metal oxide alloy layer.

Embodiments of the present invention provide a method of manufacturing a gate structure, which includes a gate insulation layer having improved leakage current characteristics and a high dielectric constant, and a method of manufacturing a capacitor, which includes a dielectric layer having improved leakage current characteristics and a high dielectric constant.

According to an embodiment of the present invention, a metal oxide alloy layer comprises a first layer including a first metal oxide and having a first thickness, and a second layer formed on the first layer, the second layer including a second metal oxide and having a second thickness, wherein a value of the first thickness is such that the first metal oxide is allowed to move into the second layer and a value of the second thickness is such that the second metal oxide is allowed to move into the first layer to form a single-layered structure in which the first and second metal oxides are mixed.

According to another embodiment of the present invention, a method of forming a metal oxide alloy layer comprises forming a first layer on a substrate, the first layer including a first metal oxide and having a first thickness, and forming a second layer on the first layer, the second layer including a second metal oxide and having a second thickness, wherein a value of the first thickness is such that the first metal oxide is allowed to move into the second layer and a value of the second thickness is such that the second metal oxide is allowed to move into the first layer to form a single-layered structure in which the first and second metal oxides are mixed.

According to another embodiment of the present invention, a method of manufacturing a gate structure comprises forming a first layer on a substrate, the first layer including a first metal oxide and having a first thickness for allowing the first metal oxide to move out of the first layer, forming a second layer on the first layer, the second layer including a second metal oxide and having a second thickness for allowing the second metal oxide to move out of the second layer, repeatedly forming the first and second layers wherein the first metal oxide and the second metal oxide move into the second layer and the first layer, respectively, to form a gate insulation layer having a single-layered structure in which the first and second metal oxides are mixed, forming a gate conductive layer on the gate insulation layer; and sequentially patterning the gate conductive layer and the gate insulation layer to form a gate pattern including a gate conductive layer pattern and a gate insulation layer pattern.

According to another embodiment of the present invention, a method of manufacturing a capacitor comprises forming a lower electrode on a substrate, forming a first layer on the lower electrode, the first layer including a first metal oxide and having a first thickness for allowing the first metal oxide to move out of the first layer, forming a second layer on the first layer, the second layer containing a second metal oxide and having a second thickness for allowing the second metal oxide to move out of the second layer, repeatedly forming the first and second layers wherein the first metal oxide and the second metal oxide move into the second layer and the first layer, respectively, to form a dielectric layer having a single-layered structure in which the first and second metal oxides are mixed, and forming an upper electrode on the dielectric layer.

BRIEF DESCRIPTION OF THE DRAWINGS

Preferred embodiments of the present disclosure can be understood in more detail from the following description taken in conjunction with the accompanying drawings wherein.

DESCRIPTION OF THE EXEMPLARY EMBODIMENTS

Exemplary embodiments of the present invention will be described below in more detail with reference to the accompanying drawings. The present invention may be embodied in many different forms and should not be construed as limited to the embodiments set forth herein.

Figure 1:
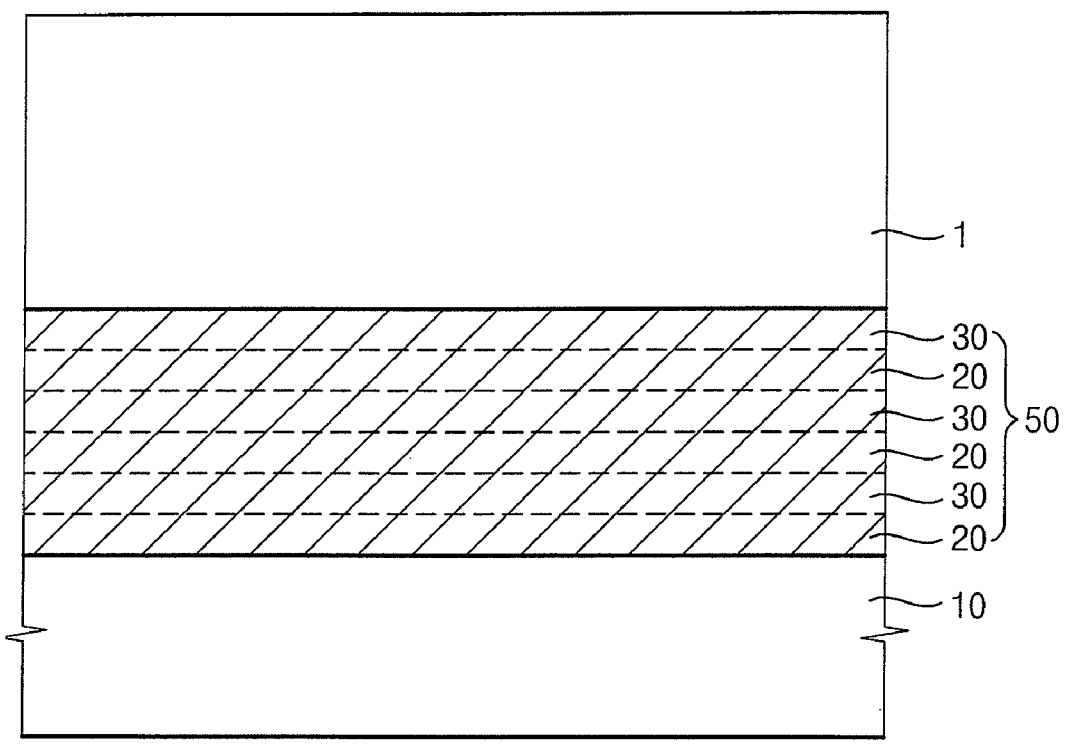
FIG. 1 is a cross-sectional view illustrating a metal oxide alloy layer in accordance with an embodiment of the present invention.

FIG. 1 is a cross-sectional view illustrating a metal oxide alloy layer in accordance with an embodiment of the present invention.

Referring to FIG. 1, a metal oxide alloy layer 50 includes a single-layered structure in which metal oxides from different metal oxide layers are mixed.

The metal oxide alloy layer 50 includes first layers 20 having a first metal oxide alternately stacked with second layers 30 having a second metal oxide that are alternately stacked. The first layer 20 has a first thickness for allowing the first metal oxide to escape from the first layer 20. The second layer 30 has a second thickness for allowing the second metal oxide to escape from the second layer 30. Thus, the first metal oxide in the first layer 20 is moved into the second layer 30 and the second metal oxide in the second layer 30 is moved into the first layer 20 so that the first and second metal oxides are mixed in the metal oxide alloy layer 50. According to an embodiment of the present invention, the first layer 20 and the second layer 30 may be formed by repeatedly performing an atomic layer deposition (ALD) process.

In an embodiment of the present invention, the first metal oxide in the first layer 20 includes, for example, aluminum oxide. The second metal oxide in the second layer 30 includes, for example, titanium oxide.

When the first layer 20 has a thickness of less than about 2 Å, the time for forming the metal oxide alloy layer 50 having a desired thickness is increased. When the first layer 20 has a thickness of more than about 6 Å, the second metal oxide in the second layer 30 does not move into the first layer 20 so that the metal oxide alloy layer 50 including the first and second layers 20 and 30 may have a laminated structure. Thus, the first layer 20 may have a thickness of about 2 Å to about 6 Å. In an embodiment of the present invention, the first layer 20 has a thickness of about 2 Å to about 5 Å.

When the second layer 30 has a thickness of less than about 2 Å, the time for forming the metal oxide alloy layer 50 having a desired thickness is increased. When the second layer 30 has a thickness of more than about 6 Å, the first metal oxide in the first layer 20 does not move into the second layer 30 so that the metal oxide alloy layer 50 including the first and second layers 20 and 30 may have a laminated structure. Thus, the second layer 30 may have a thickness of about 2 Å to about 6 Å. In an embodiment of the present invention, the second layer 30 has a thickness of about 2 Å to about 5 Å.

When the thicknesses of the first and second layers 20 and 30, respectively, are formed within a range of about 2 Å to about 6 Å, a mixture of aluminum oxide and titanium oxide in the metal oxide alloy layer 50, which is caused by the movement of aluminum oxide and titanium oxide, is formed.

When a content ratio of the first metal oxide to the second metal oxide is less than about 1:1, a breakdown voltage of a semiconductor device in which the metal oxide alloy layer 50 is employed is lowered. When a content ratio of the first metal oxide to the second metal oxide is more than about 1:5, it is difficult to form the first layer 20 with the first thickness for allowing the first oxide to escape from the first layer 20. Thus, according to an embodiment of the present invention, a content ratio of the first metal oxide to the second metal oxide is about 1:1 to about 1:5.

According to another embodiment of the present invention, the first layer 20 may include a hafnium oxide layer having hafnium oxide and the second layer 30 may include a titanium oxide layer having titanium oxide. In an embodiment of the present invention, the hafnium oxide layer and the titanium oxide layer may have thicknesses of about 2 Å to about 6 Å, respectively. A content ratio of the hafnium oxide to the titanium oxide is about 1:1 to about 1:5.

As described above, since the first and second metal oxides are mixed in the first and second layers 20 and 30, the metal oxide alloy layer 50 has a single-layered structure. The metal oxide alloy layer 50 including aluminum oxide and titanium oxide mixed therein may be used as a gate insulation layer of a gate structure or as a dielectric layer of a capacitor.

FIGS. 2 to 11 are cross-sectional views illustrating a method of forming the metal oxide alloy layer 50 in FIG. 1 in accordance with an embodiment of the present invention.

Figure 2:
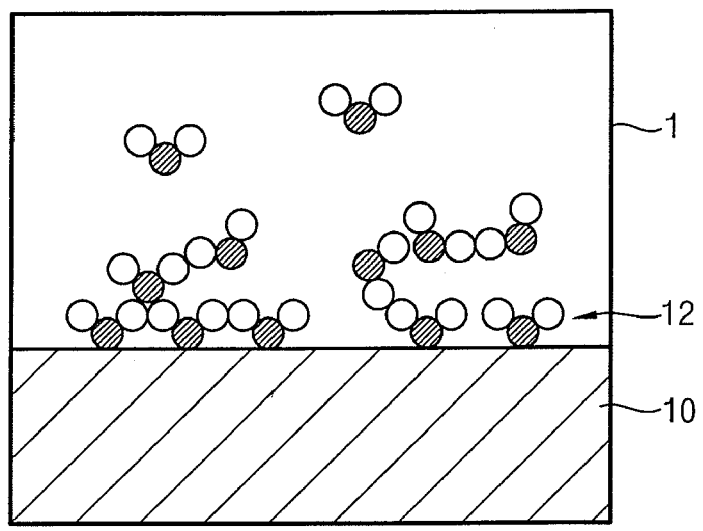
FIGS. 2 to 11 are cross-sectional views illustrating a method of forming a metal oxide alloy layer in accordance with an embodiment of the present invention.

Referring to FIG. 2, a semiconductor substrate 10 is loaded into a chamber 1. A first metal precursor 12 such as, for example, an aluminum precursor is physisorbed and chemisorbed on the semiconductor substrate 10.

When the chamber 1 has a temperature of less than about 150° C., a reactivity of the first metal precursor 12 is low. When the chamber 1 has a temperature of more than about 500° C., the first metal precursor 12 is rapidly crystallized so that characteristics of a chemical vapor deposition (CVD) process, rather than those of an atomic layer deposition (ALD) process, are shown in a layer formed on the semiconductor substrate 10. Thus, the chamber 1 may have a temperature of about 150° C. to about 500° C. to perform an atomic layer deposition (ALD). In an embodiment of the present invention, the chamber has a temperature of about 200° C. to about 400° C., for example, about 300° C.

The first metal precursor 12, as a reaction material (i.e., reactant), is introduced into the chamber 1 and is applied to a surface of the semiconductor substrate 10.

Examples of the first metal precursor 12 include an aluminum precursor and a hafnium precursor. Examples of the aluminum precursor may include $Al[CH_3]_3$ (tri methyl aluminum; TMA), $Al[OC_4H_8OCH_3]_3$, $Al[OCH_3]_3$, $Al[OC_2H_5]_3$, $Al[OC_3H_7]_3$, and $Al[OC_4H_9]_3$. These aluminum precursors can be used alone or in a combination thereof.

Examples of the hafnium precursor may include $Hf[N(CH_3)_2]_4$ (TDMAH, tetrakis dimethyl amino hafnium), $Hf[N(C_2H_5)CH_3]_4$ (TEMAH, tetrakis ethyl-methyl-amino hafnium), $Hf[N(C_2H_5)_2]_4$ (TDEAH, tetrakis diethyl-amino hafnium), $Hf[OC(CH_3)_2CH_2OCH_3]_4$, $Hf[OC(CH_3)_3]_4$, $Hf(NEt)_2(DMAMP)_2$, $Hf(OtBu)_2(NEtMe)_2$, and $Hf(OtBu)_2(NEt)_2$. These hafnium precursors can be used alone or in a combination thereof.

In an embodiment of the present invention, the aluminum precursor, in particular, $Al[CH_3]_3$ is used as the first metal precursor 12. The aluminum precursor 12 is applied to the surface of the semiconductor substrate 10 for about 0.5 seconds to about 3 seconds. In an embodiment of the present invention, the aluminum precursor 12 is applied to the surface of the semiconductor substrate 10 for about 1 second. When the aluminum precursor 12 is introduced into the chamber 1, a first portion of the aluminum precursor 12 corresponding to aluminum atoms is chemisorbed on the semiconductor substrate 10 and a second portion of the aluminum precursor corresponding to a ligand (e.g., a methyl group) is physisorbed on the semiconductor substrate 10.

Figure 3:
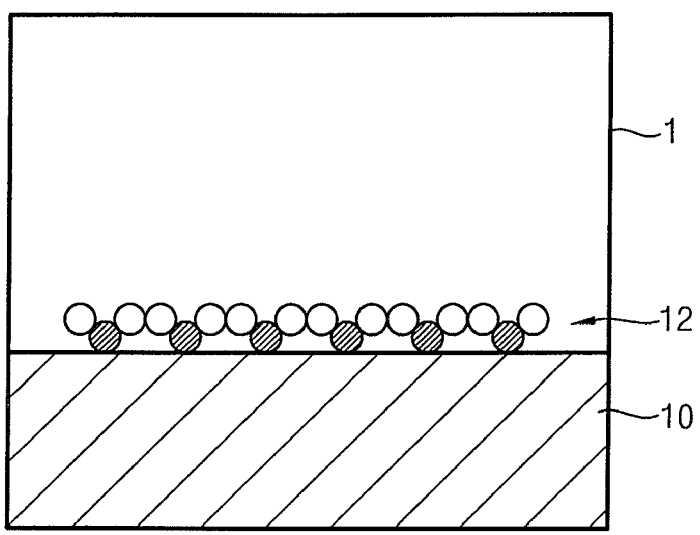

Referring to FIG. 3, a purge gas is introduced into the chamber 1 for about 0.5 seconds to about 3 seconds to detach the physisorbed second portion of the aluminum precursor 12 from the semiconductor substrate 10. Examples of the purge gas include an argon gas and a nitrogen gas. When the argon gas is used as the purge gas, the argon gas may be applied to the surface of the semiconductor substrate 10 for about 1 second.

The argon gas collides with the methyl group ligand bonded with the aluminum precursor 12 to detach the methyl group from the semiconductor substrate 10. Although the argon gas is introduced into an upper space of the semiconductor substrate 10, the first portion of the aluminum precursor 12 chemisorbed on the semiconductor substrate 10 remains.

Alternatively, a vacuum may be applied to the chamber 1 for about 2 seconds to about 3 seconds to detach the methyl group from the semiconductor substrate 10.

Figure 4:
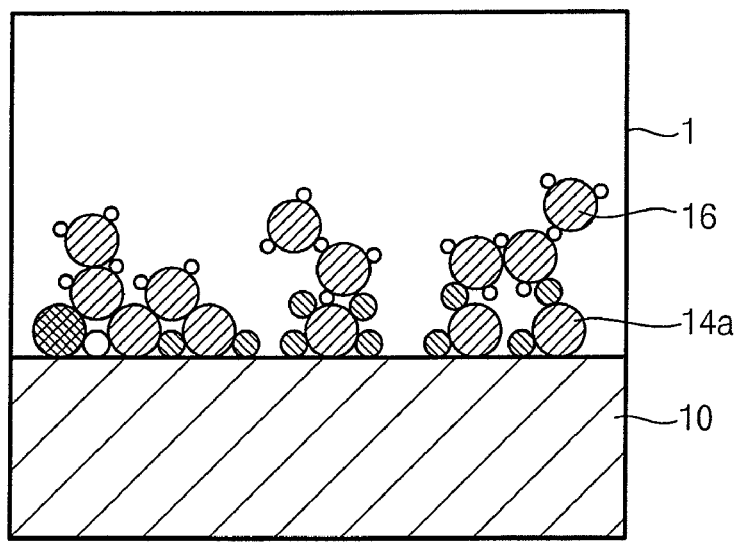

Referring to FIG. 4, an oxidizing agent 16 is introduced into the chamber 1. The oxidizing agent 16 is physisorbed on the first portion of the aluminum precursor 12 to form a first preliminary solid material 14a including aluminum oxide and the oxidizing agent 16.

Examples of the oxidizing agent 16 may include $O_3$, $H_2O$, $H_2O_2$, $CH_3OH$, and $C_2H_5OH$. These oxidizing agents can be used alone or in a combination thereof. In an embodiment of the present invention, the $O_3$ is used as the oxidizing agent 16. The $O_3$ may be introduced into the chamber 1 for about 1 second to about 5 seconds. In an embodiment of the present invention, the $O_3$ may be introduced into the chamber 1 for about 2 seconds. When the $O_3$ is applied to the surface of the semiconductor substrate 10, the aluminum chemisorbed on the semiconductor substrate 10 is oxidized to form the first preliminary solid material 14a including aluminum oxide and the oxidizing agent 16 physisorbed on aluminum oxide.

Figure 5:
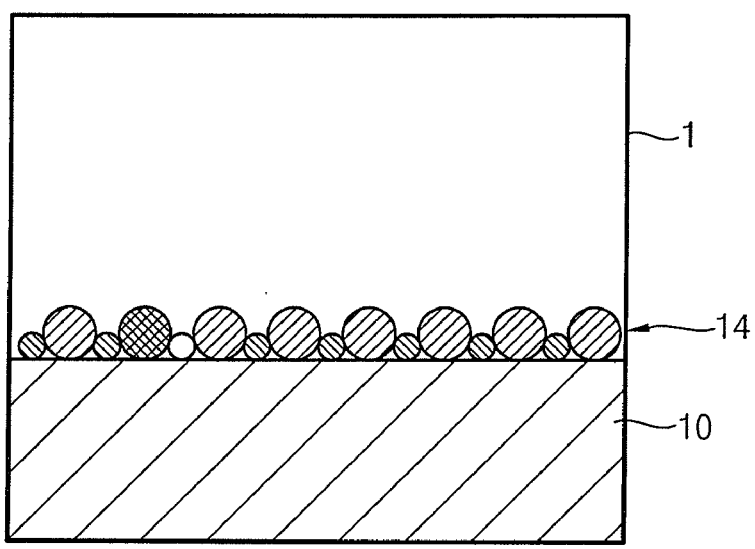

Referring to FIG. 5, a purge gas is applied to the semiconductor substrate 10 having the first preliminary solid material 14a to form a first solid material 14. An example of the purge gas includes an argon gas. The argon gas may be introduced into the chamber 1 for about 0.5 seconds to about 2 seconds, for example, about 1 second. The purge gas removes the oxidizing agent 16 remaining in the chamber 1 to form the first solid material 14 containing aluminum oxide.

Figure 6:
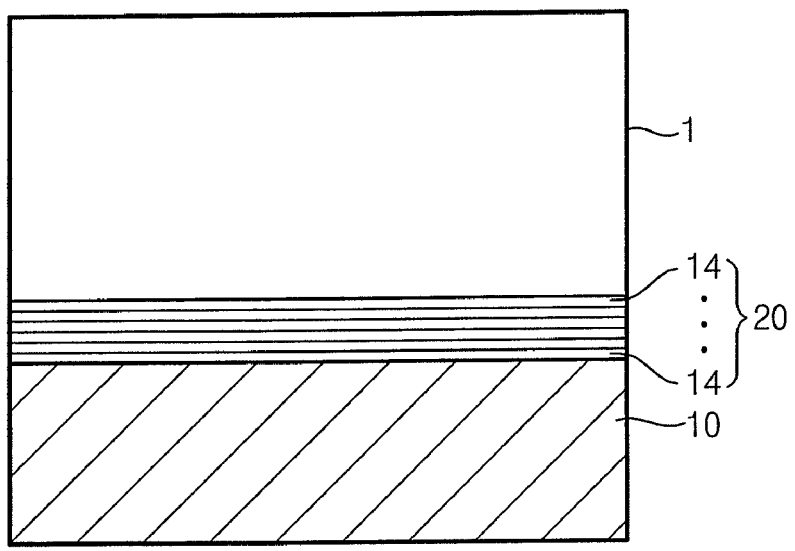

Referring to FIG. 6, a cycle for forming the first solid material 14, which includes introducing the aluminum precursor 12, introducing the argon gas, introducing the oxidizing agent and reintroducing the argon gas, is repeated about 2 times to about 10 times to form an aluminum oxide layer 20.

In an embodiment of the present invention, the aluminum oxide layer 20 includes aluminum oxide. The aluminum oxide layer 20 has a thickness for allowing aluminum oxide to escape from the aluminum oxide layer 20. When the aluminum oxide layer 20 has a thickness of less than about 2 Å, time for forming the metal oxide alloy layer 50 having a desired thickness is increased. When the aluminum oxide layer 20 has a thickness of more than about 6 Å, metal oxide in the metal oxide alloy layer 50 are not moved into the different layers in the metal oxide alloy layer 50 so that the aluminum oxide layer 20 may have a laminated structure. Thus, the aluminum oxide layer 20 may have a thickness of about 2 Å to about 6 Å. In an embodiment of the present invention, the aluminum oxide layer 20 has a thickness of about 3 Å to about 5 Å.

The aluminum precursor may be introduced into the chamber 1 to form the first solid material 14 having a thickness of about 0.5 Å to about 2 Å. In an embodiment of the present invention, the aluminum precursor is introduced into the chamber 1 in one cycle to form the first solid material 14 having a thickness of about 0.8 Å to about 1.2 Å.

Figure 7:
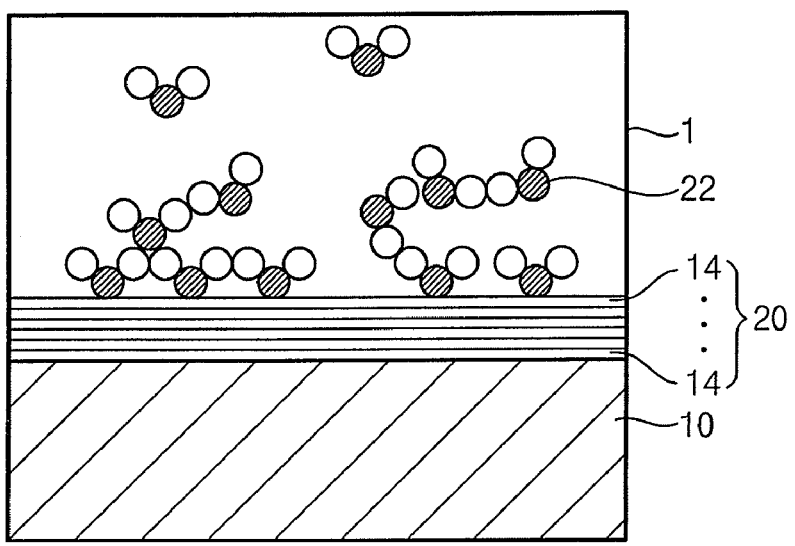

Referring to FIG. 7, a second metal precursor 22 is applied to the aluminum oxide layer 20. The second metal precursor 22 is physisorbed and chemisorbed on the aluminum oxide layer 20.

In an embodiment of the present invention, titanium is used as the second metal precursor 22. Examples of the titanium precursor may include $TiCl_4$, $Ti(OtBu)_3(CH_3)$, $Ti(OtBu)_3H$, $Ti(OtBu)_3Cl$, titanium tetraisopropoxide (TTIP), $Ti(NEtMe)_4$, and $Ti(OtBu)_4$. These titanium precursors can be used alone or in a combination thereof.

In an embodiment of the present invention, the $Ti(OtBu)_3(CH_3)$ is used as the titanium precursor 22. The titanium precursor 22 including $Ti(OtBu)_3(CH_3)$ is applied to the aluminum oxide layer 20 for about 0.5 seconds to about 3 seconds. In an embodiment of the present invention, the titanium precursor 22 is applied to the aluminum oxide layer 20 for about 1 second. When the titanium precursor 22 is introduced into the chamber 1, a first portion of the titanium precursor 22 is chemisorbed on the aluminum oxide layer 20 and a second portion of the titanium precursor 22 is physisorbed on the aluminum oxide layer 20.

Figure 8:
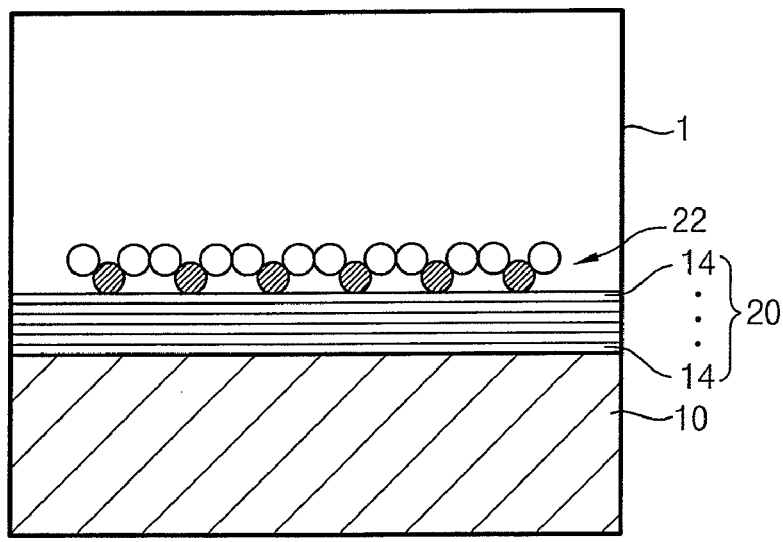

Referring to FIG. 8, a purge gas is introduced into the chamber 1 for about 0.5 seconds to about 3 seconds to detach the physisorbed second portion of the titanium precursor 22 from the aluminum oxide layer 20. In an embodiment of the present invention, an example of the purge gas includes an argon gas. When the argon gas is used as the purge gas, the argon gas may be applied to the aluminum oxide layer 20 for about 1 second. The argon gas hits a tert-butoxy (OtBu) group in the titanium precursor 22 to detach the tert-butoxy group from the aluminum oxide layer 20. Although the argon gas is introduced into an upper space of the aluminum precursor 20, the first portion of the titanium precursor 22 chemisorbed on the aluminum oxide layer 20 remains.

Figure 9:
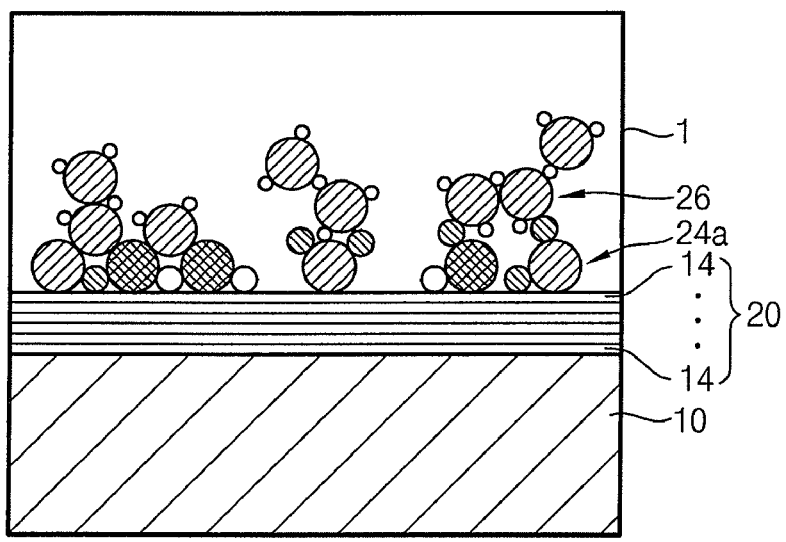

Referring to FIG. 9, an oxidizing agent 26 is introduced into the chamber 1. The oxidizing agent 26 is physisorbed on the first portion of the titanium precursor 22 to form a second preliminary solid material 24a including titanium oxide.

The oxidizing agent 26 is substantially the same as the oxidizing agent 16. In an embodiment of the present invention, $O_3$ is used as the oxidizing agent 26. $O_3$ may be introduced into the chamber 1 for about 1 second to about 5 seconds In an embodiment of the present invention, $O_3$ is introduced into the chamber 1 for about 2 seconds. When $O_3$ is applied to the aluminum oxide layer 20, the titanium chemisorbed on the aluminum oxide layer 20 is oxidized to form the second preliminary solid material 24a including titanium oxide on the aluminum oxide layer 20. In an embodiment of the present invention, since the titanium precursor 22 is hydrophilic, the titanium is readily oxidized. When a nitrogen material is chemisorbed on the second preliminary solid material 24a, the second preliminary solid material 24a may include the nitrogen material as well as titanium oxide.

Figure 10:
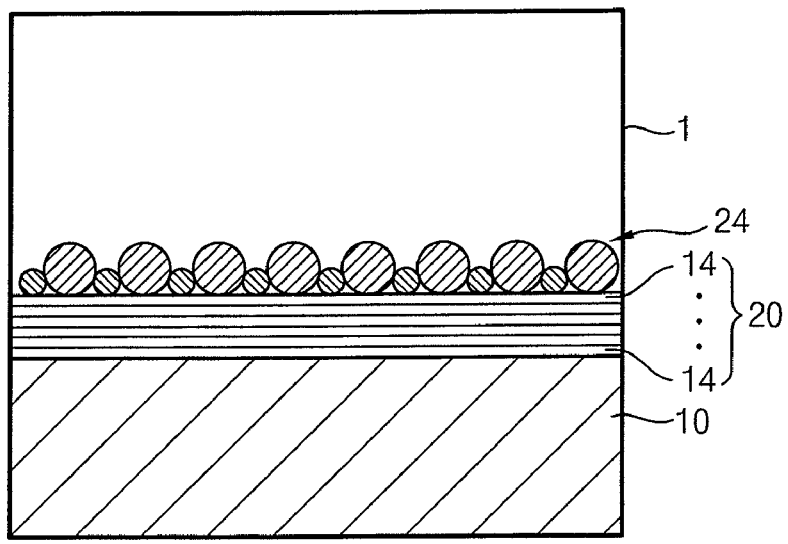

Referring to FIG. 10, a purge gas is applied to the second preliminary solid material 24a to form a second solid material 24. An example of the purge gas includes an argon gas. The argon gas may be introduced into the chamber 1 for about 0.5 seconds to about 2 seconds. In an embodiment of the present invention, the argon gas is introduced into the chamber about 1 second. The purge gas removes the oxidizing agent 26 remaining in the chamber 1 to form the second solid material 24 containing titanium oxide. The titanium precursor may be introduced into the chamber 1 to form the second solid material 24 having a thickness of about 0.5 .ANG. to about 2 .ANG. In an embodiment of the present invention, the titanium precursor is introduced into the chamber in one cycle to form the second solid material having a thickness of about 0.8 Å to about 1.2 Å.

Figure 11:
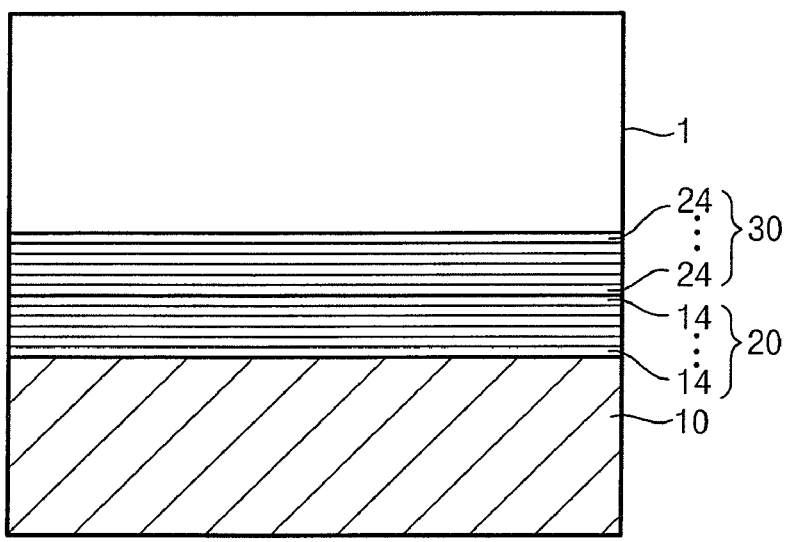

Referring to FIG. 11, a cycle for forming the second solid material 24, which includes introducing the titanium precursor 22, introducing the argon gas, introducing the oxidizing agent 26 and reintroducing the argon gas, is repeated about 2 times to about 10 times to form a titanium oxide layer 30.

In an embodiment of the present invention, the titanium oxide layer 30 has a thickness for allowing titanium oxide to escape from the titanium oxide layer 30. When the titanium oxide 30 has a thickness of less than about 2 Å, the time for forming the metal oxide alloy layer 50 having a desired thickness is increased. When the titanium oxide layer 30 has a thickness of more than about 6 Å, metal oxides in the metal oxide alloy layer 50 are not moved into different layers in the metal oxide alloy layer 50 so that the titanium oxide layer 30 may have a laminated structure. Thus, the titanium oxide layer 30 may have a thickness of about 2 Å to about 6 Å. In embodiment of the present invention, the titanium oxide layer 30 has a thickness of about 3 Å to about 5 Å.

The process for forming the aluminum oxide layer 20 and the process for forming the titanium oxide layer 30 are repeated at least once to form the metal oxide alloy layer 50 including aluminum oxide and titanium oxide.

In an embodiment of the present invention, the cycle for forming the aluminum oxide layer 20, which includes sequentially introducing the aluminum precursor, the argon gas, the oxidizing agent and the argon gas, and the cycle for forming the titanium oxide layer 30, which includes sequentially introducing the titanium precursor, the argon gas, the oxidizing agent and the argon gas, are repeated at least once to form the metal oxide alloy layer 50. Thus, the cycles for forming the aluminum oxide layer 20 and the titanium oxide layer 30 are adjusted so that the content ratio of aluminum oxide and titanium oxide in the metal oxide alloy layer 50 may be controlled.

FIGS. 12 to 15 are cross-sectional views illustrating a method of forming a metal oxide alloy layer in accordance with another embodiment of the present invention.

Figure 12:
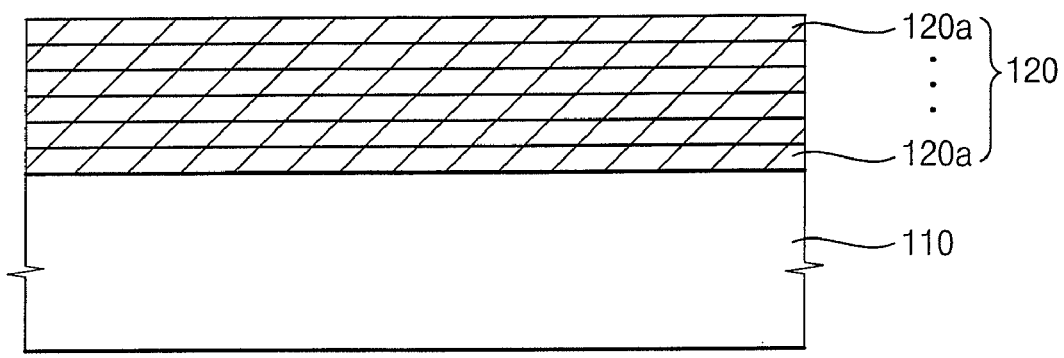
FIGS. 12 to 15 are cross-sectional views illustrating a method of forming a metal oxide alloy layer in accordance with another embodiment of the present invention.

Referring to FIG. 12, a cycle for forming a first solid material 120a, which includes sequentially introducing a hafnium precursor, introducing an argon gas, introducing an oxidizing agent and introducing an argon gas, is repeated about 2 times to about 10 times. In an embodiment of the present invention, the cycle for forming the first solid material 120a is repeated about 5 times to about 8 times to form a hafnium oxide layer 120.

In an embodiment of the present invention, the hafnium oxide layer 120 includes hafnium oxide. The hafnium oxide layer 120 has a thickness of about 2 Å to about 6 Å In an embodiment of the present invention, the hafnium oxide layer 120 has a thickness of about 3 Å to about 5 Å. Examples of the hafnium precursor have been described above and a process for forming the first solid material 120a is substantially the same as that illustrated for the previous embodiment.

Figure 13:
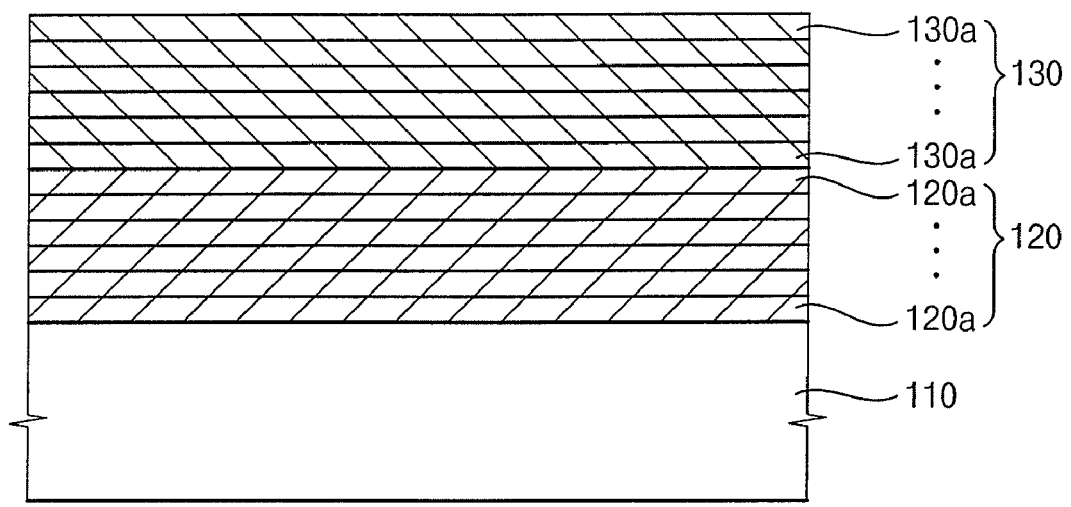

Referring to FIG. 13, a cycle for forming a second solid material 130a, which includes sequentially introducing a titanium precursor, an argon gas, an oxidizing agent and an argon gas, is repeated about 2 times to about 10 times to form a titanium oxide layer 130.

In an embodiment of the present invention, the titanium oxide layer 130 includes titanium oxide. The titanium oxide layer 130 has a thickness of about 2 Å to about 6 Å. In an embodiment of the present invention, the titanium oxide layer 130 has a thickness of about 3 Å to about 5 Å. Examples of the titanium precursor have been described above and a process for forming the second solid material 130a is substantially the same as that illustrated for the previous embodiment.

Figure 14:
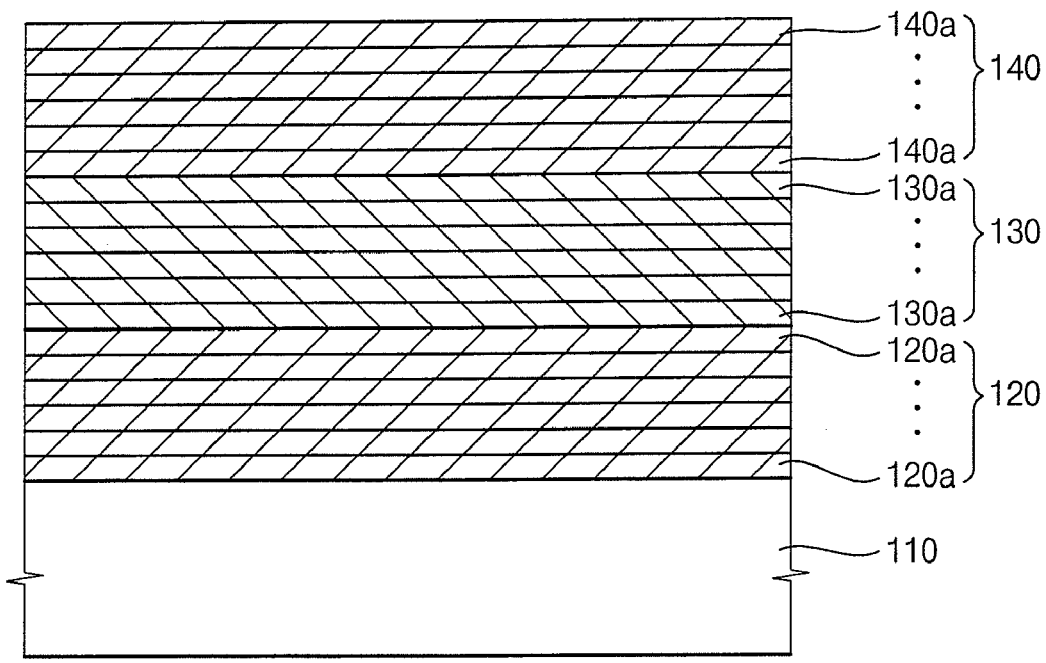

Referring to FIG. 14, a cycle for forming a third solid material 140a, which includes sequentially introducing a metal precursor different from the hafnium precursor and the titanium precursor, an argon gas, an oxidizing agent and an argon gas, is repeated about 2 times to about 10 times to form a third layer 140. In an embodiment of the present invention, the third layer 140 includes an aluminum oxide layer containing aluminum oxide.

The aluminum oxide layer 140 may have a thickness of about 2 Å to about 6 Å. In an embodiment of the present invention, the aluminum oxide layer 140 has a thickness of about 3 Å to about 5 Å. Examples of the aluminum precursor have been described above and a process for forming the aluminum oxide layer 140 is substantially the same as that illustrated for the previous embodiment.

Figure 15:
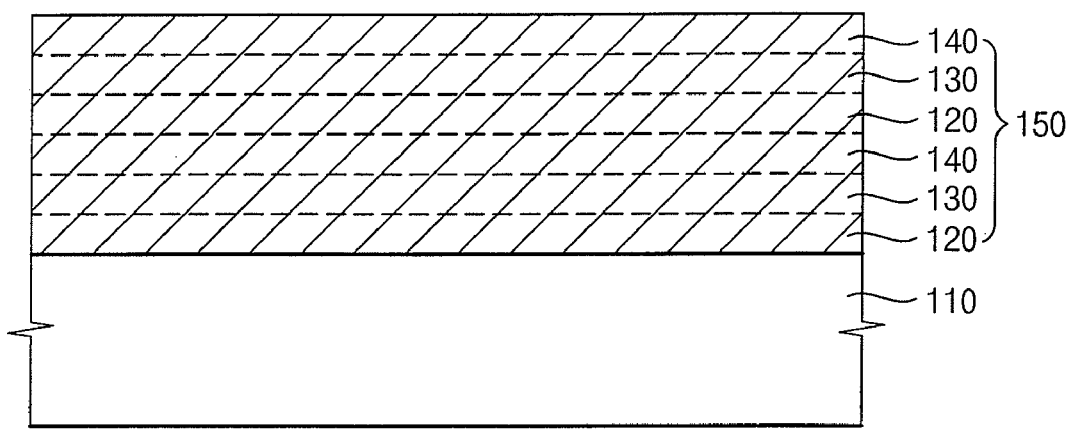

Referring to FIG. 15, the cycle for forming the hafnium oxide layer 120, the cycle for forming the titanium oxide layer 130, and the cycle for forming the aluminum oxide layer 140 are repeated at least once to form the metal oxide alloy layer 150 having a single-layered structure in which hafnium oxide, titanium oxide and aluminum oxide are mixed.

According to embodiments of the present invention, the thicknesses of the hafnium oxide layer 120, the titanium oxide layer 130 and the aluminum oxide layer 140 are controlled so that content ratios of hafnium oxide, titanium oxide and aluminum oxides may be adjusted. Thus, the metal oxide alloy layer 150 having a single-layered structure in which hafnium oxide, titanium oxide and aluminum oxide are mixed may be manufactured.

Figure 16:
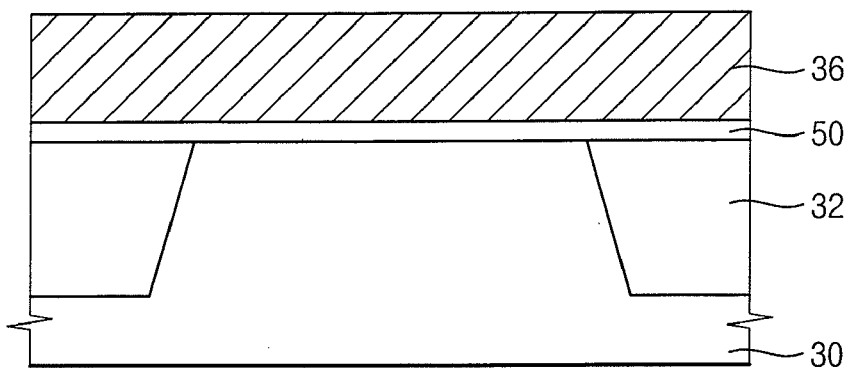
FIGS. 16 and 17 are cross-sectional views illustrating a method of manufacturing a gate structure in accordance with an embodiment of the present invention.
Figure 17:
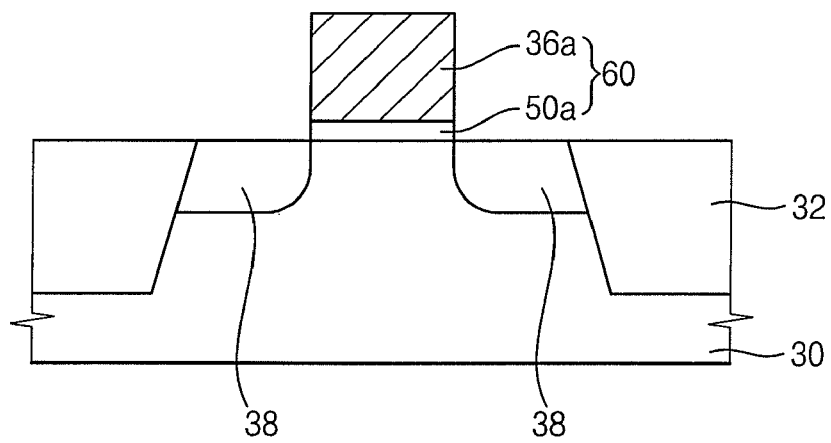

FIGS. 16 and 17 are cross-sectional views illustrating a method of manufacturing a gate structure in accordance with an embodiment of the present invention.

Referring to FIG. 16, a semiconductor substrate 30 such as a silicon substrate is prepared. A trench isolation layer 32 is formed in the semiconductor substrate 30 to define an active region and a field region of the semiconductor substrate 30.

An ALD process substantially identical to that described in connection with FIGS. 2-11 is performed on the semiconductor substrate 30 to form a gate insulation layer 50 having a single-layered structure in which aluminum oxide and titanium oxide are mixed. The gate insulation layer 50 includes an aluminum oxide layer (not shown) having a thickness of about 2 Å to about 6 Å, and a titanium oxide layer (not shown) having a thickness of about 2 Å to about 6 Å.

A silicon oxide layer (not shown) having a thickness of about 5 Å may be formed on the gate insulation layer 50. Alternatively, after a gate insulation layer including hafnium titanium oxide material is formed, the silicon oxide layer may be formed in-situ.

A gate conductive layer 36 is formed on the gate insulation layer 50 by, for example, a CVD process. Examples of the gate conductive layer 36 include polysilicon, a metal, and metal nitride.

Referring to FIG. 17, the gate conductive layer 36 and the gate insulation layer 50 are patterned by a photolithography process to form a gate structure 60 including a gate insulation layer pattern 50*a* and a gate conductive layer pattern 36*a*.

Impurities are then implanted into the semiconductor substrate 30 using the gate structure 60 as an ion implantation mask to form source/drain regions 38. Alternatively, before forming the gate insulation layer 50, the source/drain regions 38 may be formed. In an embodiment of the present invention, after forming the gate structure 60, a gate spacer (not shown) may be formed on a sidewall of the gate structure 60.

According to embodiments of the present invention, a metal oxide alloy layer having a single-layered structure in which aluminum oxide and titanium oxide having a high dielectric constant is mixed is used as the gate insulation layer 50. The aluminum oxide layer and the titanium oxide layer have thicknesses of about 2 Å to about 6 Å, respectively, so that the gate insulation layer 50 including aluminum oxide and titanium oxide mixed therein is formed. Thus, although the gate insulation layer pattern 50*a* has a thin equivalent oxide thickness (EOT), a leakage current between the gate insulation layer pattern 50*a* and the semiconductor substrate 30 may be minimized.

Figure 18:
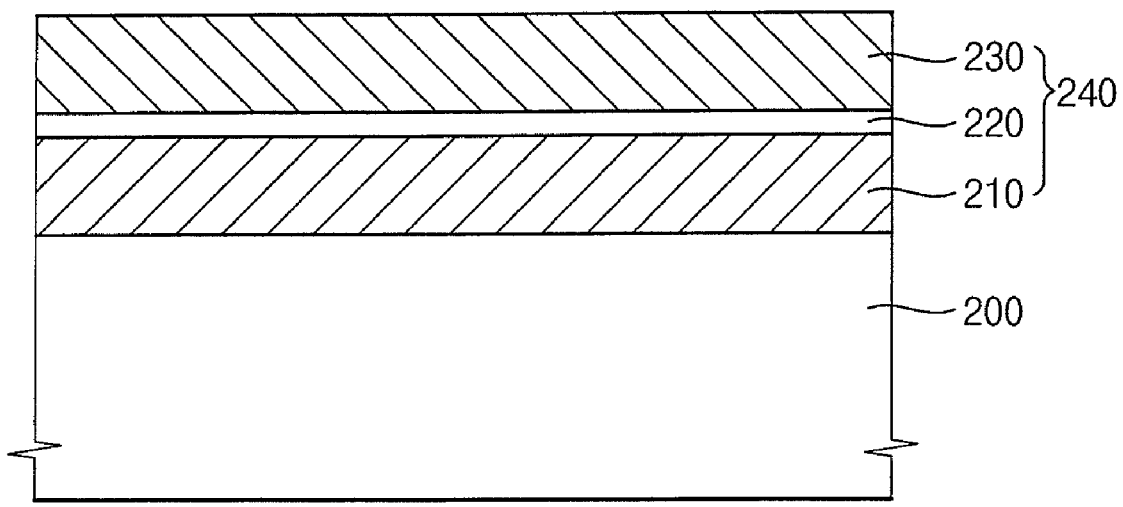
FIG. 18 is a cross-sectional view illustrating a method of manufacturing a capacitor in accordance with an embodiment of the present invention.

FIG. 18 is a cross-sectional view illustrating a method of manufacturing a capacitor in accordance with an embodiment of the present invention.

Referring to FIG. 18, a silicon substrate 200 is prepared. When a semiconductor device including the silicon substrate 200 corresponds to a dynamic random access memory (DRAM), a semiconductor structure (not shown) such as, for example, a gate structure (not shown) and a bit line (not shown), may be formed on the silicon substrate 200.

A lower electrode 210 is formed on the silicon substrate 200 by, for example, a CVD process. Examples of a material that may be used for the lower electrode 210 include polysilicon, a metal, and a metal nitride. To expand an effective area of the lower electrode 210, the lower electrode 210 may have a cylindrical shape.

An ALD process is performed as described above with reference to FIGS. 2-11 to form a dielectric layer 220 containing aluminum oxide and titanium oxide on the lower electrode 210. The dielectric layer 220 includes an aluminum oxide layer (not shown) having a thickness of about 2 Å to about 6 Å, and a titanium oxide layer (not shown) having a thickness of about 2 Å to about 6 Å. Thus, aluminum oxide and titanium oxide are mixed in the dielectric layer 220 so that the dielectric layer 220 has a single-layered structure.

An upper electrode 230 is formed on the dielectric layer 220 by, for example, a CVD process. Examples of a material that may be used for the upper electrode 230 include polysilicon, a metal, and a metal nitride. A capacitor 240 including the lower electrode 210, the dielectric layer 220 and the upper electrode 230 is formed on the silicon substrate 200.

According to an embodiment of the present invention, a metal oxide alloy layer including aluminum oxide and titanium oxide having a high dielectric constant is used as the dielectric layer 220. Content ratios of aluminum oxide and titanium oxide in the metal oxide alloy layer are properly adjusted so that the metal oxide alloy layer having a dielectric constant of no less than about 50 may be used as the dielectric layer 220.

An ALD process as described above with reference to FIGS. 2-11 is performed on a lower electrode to form a metal oxide alloy layer as a dielectric layer. An upper electrode is then formed on the dielectric layer to complete a capacitor.

Figure 19:
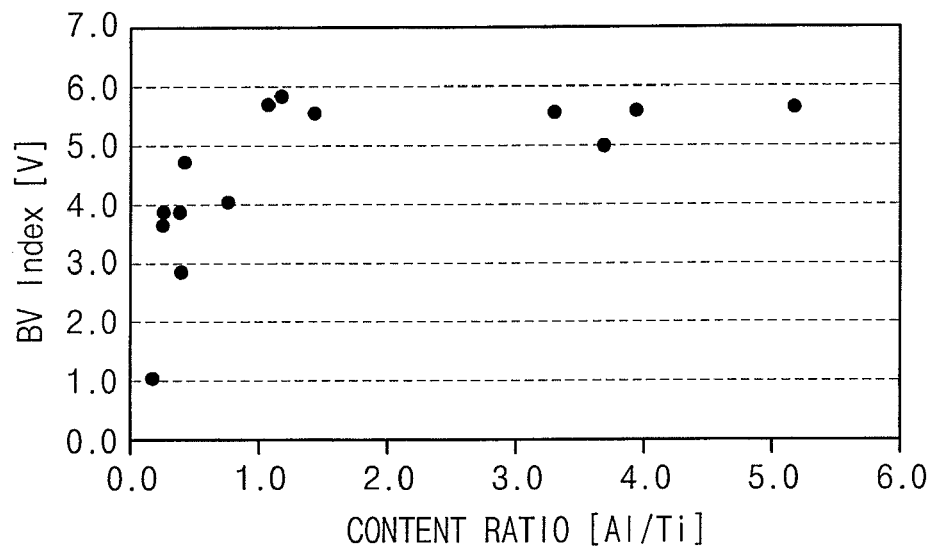
FIG. 19 is a graph illustrating a relationship between a breakdown voltage of a metal oxide alloy layer and content ratios of aluminum oxide and titanium oxide in the metal oxide alloy layer.

Referring to FIG. 19, breakdown voltages of metal oxide alloy layers in accordance with content ratios of aluminum oxide and titanium oxide in each of the metal oxide alloy layers were evaluated. Each of the content ratios of aluminum oxide with respect to titanium oxide was 1:0.2, 1:0.5, 1:0.8, 1:1, 1:0.5, 1:3.5, 1:4 and 1:5, respectively.

After a voltage was applied to the capacitor, breakdown voltages of the dielectric layer in accordance with content ratios of aluminum oxide and titanium oxide in the dielectric layer were measured. The measured breakdown voltages are shown in FIG. 19.

As shown in FIG. 19, when the content ratio of aluminum oxide with respect to titanium oxide is more than 1:1, the breakdown voltage is no less than 5V. Thus, when the metal oxide alloy layer is used as the dielectric layer of the capacitor, the capacitor has a high dielectric constant.

Figure 20:
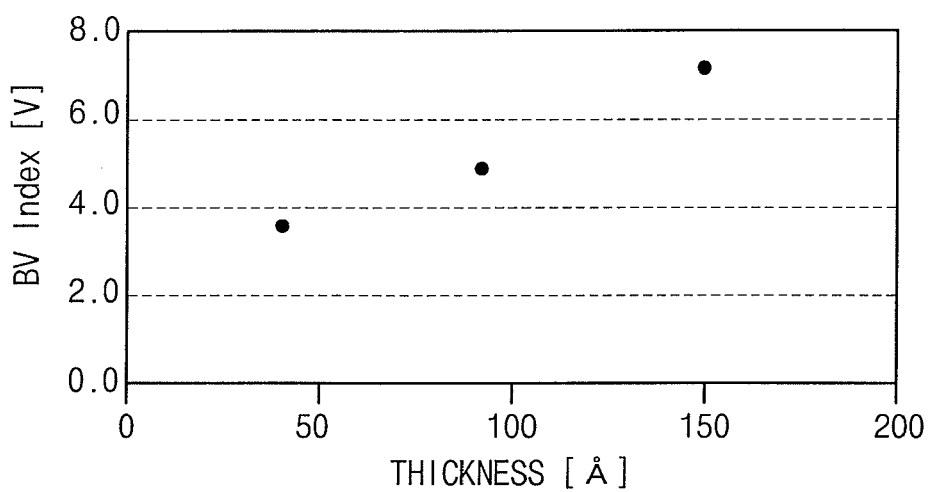
FIG. 20 is a graph illustrating a relationship between a breakdown voltage of a metal oxide alloy layer and thicknesses of the metal oxide alloy layer including an aluminum titanium oxide material.

Referring to FIG. 20, breakdown voltages of metal oxide alloy layers in accordance with thickness of aluminum oxide and titanium oxide in each of the metal oxide alloy layers were evaluated.

Metal oxide alloy layers having thicknesses of 50 Å, 100 Å and 150 Å, respectively, were formed. The metal oxide alloy layers were employed as a dielectric layer of a capacitor. After a voltage was applied to the capacitor, breakdown voltages of the dielectric layer in accordance with the thicknesses of aluminum oxide and titanium oxide in the dielectric layer were measured. The measured breakdown voltages are shown in FIG. 20.

As shown in FIG. 20, the breakdown voltage is increased in proportion to an increase of the thickness of the metal oxide alloy layer. Thus, when the metal oxide alloy layer is used as the dielectric layer of the capacitor, the capacitor has a high dielectric constant.

According to an embodiment of the present invention, the process for forming the first layer that has the first thickness for allowing the first metal oxide to escape from the first layer, and the process for forming the second layer that has the second thickness for allowing the second metal oxide to escape from the second layer are repeated at least once so that the metal oxide alloy layer has a single-layered structure in which the first and second metal oxides are mixed. Thus, the metal oxide alloy layer containing at least two metal oxides has a high dielectric constant. When the metal oxide layer is used as the gate insulation layer or as the dielectric layer, a semiconductor device including the gate insulation layer or the dielectric layer may have improved electrical characteristics.

Although preferred embodiments have been described with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

What is claimed is:
1. A method of manufacturing a gate structure, comprising:

forming a first layer on a substrate, the first layer including a first metal oxide and having a first thickness for allowing the first metal oxide to move out of the first layer;

forming a second layer on the first layer, the second layer including a second metal oxide and having a second thickness for allowing the second metal oxide to move out of the second layer;

repeatedly forming the first and second layers wherein the first metal oxide and the second metal oxide move into the second layer and the first layer, respectively, to form a gate insulation layer having a single-layered structure in which the first and second metal oxides are mixed;

forming a gate conductive layer on the gate insulation layer; and sequentially patterning the gate conductive layer and the gate insulation layer to form a gate pattern including a gate conductive layer pattern and a gate insulation layer pattern.

2. The method of claim 1, wherein the first and second thicknesses are about 2 Å to about 6 Å, respectively.

3. The method of claim 1, wherein forming the first layer comprises:
applying a first metal precursor to a surface of the substrate;
chemisorbing a first portion of the first metal precursor on the substrate and physisorbing a second portion of the first metal precursor on the substrate;
removing the second portion of the first metal precursor;
applying an oxidizing agent to the surface of the substrate;
chemically reacting the first portion of the first metal precursor with the oxidizing agent to form a first solid material containing the first metal oxide on the substrate;
removing a remaining portion of the oxidizing agent which did not react with the first portion of the first metal precursor, wherein each of the steps for forming the first layer, from applying the first metal precursor to removing a remaining portion of the oxidizing agent, comprise one cycle; and
repeating the one cycle about 2 times to about 10 times.

4. The method of claim 3, wherein the first solid material having a thickness of about 0.1 Å to about 2 Å is formed by the one cycle.

5. The method of claim 3, wherein the first metal precursor comprises a hafnium precursor or an aluminum precursor.

6. The method of claim 1, wherein forming the second layer comprises:
applying a second metal precursor to a surface of the first layer on the substrate;
chemisorbing a first portion of the second metal precursor on the first layer and physisorbing a second portion of the second metal precursor on the first layer;
removing the second portion of the second metal precursor;
applying an oxidizing agent to the first layer;
chemically reacting the first portion of the second metal precursor with the oxidizing agent to form a second solid material containing the second metal oxide on the first layer;
removing a remaining portion of the oxidizing agent which did not react with the first portion of the second metal precursor, wherein the steps for forming the second layer, from applying the second metal precursor to removing a remaining portion of the oxidizing agent, comprise one cycle; and
repeating the one cycle about 2 times to about 10 times.

7. The method of claim 6, wherein the second metal precursor comprises a titanium precursor.

8. The method of claim 1, wherein a content ratio of the first metal oxide to the second metal oxide is about 1:1 to about 1:5.

9. The method of claim 1, further comprising forming a third layer containing a third metal oxide on the second layer, the third layer having a third thickness for allowing the third metal oxide material to move out of the third layer.

10. The method of claim 1, wherein the first metal oxide comprises hafnium oxide or aluminum oxide, and the second metal oxide comprises titanium oxide.

11. A method of manufacturing a capacitor, the method comprising:
forming a lower electrode on a substrate;
forming a first layer on the lower electrode, the first layer including a first metal oxide and having a first thickness for allowing the first metal oxide to move out of the first layer;
forming a second layer on the first layer, the second layer containing a second metal oxide and having a second thickness for allowing the second metal oxide to move out of the second layer;
repeatedly forming the first and second layers wherein the first metal oxide and the second metal oxide move into the second layer and the first layer, respectively, to form a dielectric layer having a single-layered structure in which the first and second metal oxides are mixed; and
forming an upper electrode on the dielectric layer.

12. The method of claim 11, wherein the first and second thicknesses are about 2 Å to about 6 Å, respectively.

13. The method of claim 11, wherein forming the first layer comprises:
applying a first metal precursor to a surface of the substrate;
chemisorbing a first portion of the first metal precursor on the substrate and physisorbing a second portion of the first metal precursor on the substrate;
removing the second portion of the first metal precursor;
applying an oxidizing agent to the surface of the substrate;
chemically reacting the first portion of the first metal precursor with the oxidizing agent to form a first solid material containing the first metal oxide on the substrate;
removing a remaining portion of the oxidizing agent which did not react with the first portion of the first metal precursor, wherein each of the steps for forming the first layer, from applying the first metal precursor to removing a remaining portion of the oxidizing agent, comprise one cycle; and
repeating the one cycle about 2 times to about 10 times.

14. The method of claim 13, wherein the first solid material having a thickness of about 0.1 Å to about 2 Å is formed by the one cycle.

15. The method of claim 13, wherein the first metal precursor comprises a hafnium precursor or an aluminum precursor.

16. The method of claim 11, wherein forming the second layer comprises:
applying a second metal precursor to a surface of the substrate having the first layer;
chemisorbing a first portion of the second metal precursor on the first layer and physisorbing a second portion of the second metal precursor on the first layer;
removing the second portion of the second metal precursor;
applying an oxidizing agent to the first layer;
chemically reacting the first portion of the second metal precursor with the oxidizing agent to form a second solid material containing the second metal oxide on the first layer;

removing a remaining portion of the oxidizing agent which did not react with the first portion of the second metal precursor, wherein the steps for forming the second layer, from applying the second metal precursor to removing a remaining portion of the oxidizing agent; and repeating the one cycle about 2 times to about 10 times.

17. The method of claim 16, wherein the second metal precursor comprises a titanium precursor.

18. The method of claim 11, wherein a content ratio of the first metal oxide to the second metal oxide is about 1:1 to about 1:5.

19. The method of claim 11, further comprising forming a third layer containing a third metal oxide on the second layer, the third layer having a third thickness for allowing the third metal oxide material to move out of the third layer.

20. The method of claim 11, wherein the first metal oxide comprises hafnium oxide or aluminum oxide, and the second metal oxide comprises titanium oxide.

* * * * *